United States Patent [19]

Lin

[11] Patent Number: 5,926,752
[45] Date of Patent: Jul. 20, 1999

[54] APPARATUS AND METHOD FOR REMOTE CONVENIENCE MESSAGE TRANSMISSION AND CONTROL WITH A TUNABLE FILTER RECEIVER

[75] Inventor: Xing Ping Lin, Commerce, Mich.

[73] Assignee: TRW Inc., Lyndhurst, Ohio

[21] Appl. No.: 09/007,899

[22] Filed: Jan. 15, 1998

Related U.S. Application Data

[51] Int. Cl.$^6$ ....................................... H04Q 7/18
[52] U.S. Cl. .......................... 455/323; 455/352; 455/339; 455/340; 455/266
[58] Field of Search ...................................... 455/338, 339, 455/340, 266, 313, 314, 352, 355, 151.2, 151.3; 340/825.69, 825.72

[56] References Cited

U.S. PATENT DOCUMENTS

| | | |
|---|---|---|
| 2,846,573 | 8/1958 | Mahland et al. . |
| 2,902,598 | 9/1959 | Hills . |
| 3,249,876 | 5/1966 | Harrison . |
| 3,473,128 | 10/1969 | Kiser . |
| 3,496,473 | 2/1970 | Seppeler et al. . |
| 3,634,700 | 1/1972 | Worcester . |
| 3,665,318 | 5/1972 | Hoffman et al. . |
| 3,824,475 | 7/1974 | Pflasterer . |
| 3,845,393 | 10/1974 | Basset . |
| 3,873,924 | 3/1975 | Fathauer . |
| 3,987,400 | 10/1976 | Fathauer . |
| 3,996,540 | 12/1976 | Yamada et al. . |
| 4,011,515 | 3/1977 | Hanson . |
| 4,264,976 | 4/1981 | Yamashita . |
| 4,431,990 | 2/1984 | Wycoff et al. ................. 340/825.48 X |
| 4,466,126 | 8/1984 | Fujimoto . |
| 4,792,993 | 12/1988 | Ma ..................................... 455/340 X |
| 4,965,853 | 10/1990 | Barnard ............................. 455/340 X |
| 5,023,932 | 6/1991 | Wakana . |
| 5,103,314 | 4/1992 | Keenan . |
| 5,600,323 | 2/1997 | Boschini ........................ 340/825.69 X |
| 5,752,184 | 5/1998 | Ishimura ............................ 340/825.72 |
| 5,790,043 | 8/1998 | Hettich et al. ................. 340/825.69 X |

*Primary Examiner*—Wellington Chin
*Assistant Examiner*—Yemane Woldetatios
*Attorney, Agent, or Firm*—Tarolli, Sundheim, Covell, Tummino & Szabo

[57] ABSTRACT

A system (10) for remote convenience control of performance of a function includes a portable transmitter unit (14) and a receiver unit (18). In one embodiment, the system (10) is a remote convenience vehicle system. The transmitter unit (14) transmits a signal (16). The signal has a RF frequency at an unknown value within a range of values and conveys a message that contains a function request. Within the receiver unit (18) is superheterodyne circuitry (32) that has a mixer (44). The mixer (44) mixes a RF signal (42) coming from an antenna (28) and a reference frequency signal from a reference oscillator (46), and outputs an intermediate frequency signal (50) conveying the message. A bandpass filter (66) filters the intermediate frequency signal to pass a range of frequency values smaller than a known range of intermediate frequency values. Tuning control circuitry (70) automatically adjusting the bandpass range of the bandpass filter (66) to vary the bandpass range over the intermediate frequency range. Passage detector circuitry (72) senses the intermediate frequency signal passing through the bandpass filter (66) and automatically causes the adjustment of the bandpass range to stop.

30 Claims, 4 Drawing Sheets

APPARATUS AND METHOD FOR REMOTE CONVENIENCE MESSAGE TRANSMISSION AND CONTROL WITH A TUNABLE FILTER RECEIVER

FIELD OF THE INVENTION

The present invention relates to remote convenience systems, and is particularly directed to a system, which includes a receiver unit that has a tunable filter.

DESCRIPTION OF THE PRIOR ART

Remote convenience systems are known in the art. Such remote convenience systems permit remote control of certain functions. One example type of a remote convenience system is for remotely controlling vehicle functions. Other example types of remote convenience systems include garage door opener systems and entry light activation systems.

Focusing on the remote convenience vehicle systems, remotely controlled vehicle functions include the locking and unlocking function of one or more vehicle doors. A remote convenience system that permits remote locking and unlocking is commonly referred to as a remote keyless entry system. Such remote convenience vehicle systems may provide for control of other vehicle functions. For example, a remote vehicle locator function may be provided. The vehicle locator function causes a vehicle horn to emit a horn chirp and/or the headlights of the vehicle to flash "ON". This allows a person to quickly locate their car within a crowded parking lot.

The known remote convenience vehicle systems include a receiver unit mounted in an associated vehicle and at least one portable hand-held transmitter unit located remote from the receiver unit. The receiver unit has a memory that stores one or more security codes, each of which identifies a transmitter unit that is authorized to cooperate with the receiver unit. Each transmitter unit is provided with one or more manually actuatable switches. Each switch is associated with a vehicle control function to be performed. The transmitter unit includes circuitry that responds to the actuation of one of the switches to transmit a function-request message, along with the security code, in the form of a digital signal. A signal received by the receiver unit is processed such that the vehicle performs the requested function.

The remote convenience systems operate in the ultra high frequency (UHF) portion of the radio frequency (RF) spectrum. Specifically, the signals from the transmitter units are in the UHF portion of the spectrum that is allocated by the United States Federal communications Commission (FCC) for unlicensed transmission devices. FCC regulations stipulate that such unlicensed devices cannot have a transmitted signal strength that exceeds a preset maximum. Also, some countries only permit very low levels of transmitted power. The permitted power level in these countries is lower that the permitted level in the United States. For example, in Japan, remote convenience transmitter units have typical transmission power levels 30 dB below that of a typical United States remote convenience transmitter unit.

Often, it is desirable to accomplish remote control performance of certain functions at a longest possible distance. One example of such a function that is performed at the longest possible distance is the remote vehicle locator function. To illustrate such a scenario, consider a shopping mall patron exiting a shopping mall building and being faced with the task of visually locating their car within a vast shopping mall parking lot. It would be beneficial to be able to actuate the remote vehicle locator function from a location near the exit door of the shopping mall, before proceeding into the parking lot.

In order for a receiver unit located within the associated vehicle to receive a low power signal, the receiver must have a high sensitivity. One solution for providing high sensitivity within the receiver unit is to use superheterodyne circuitry. However, in order for a superheterodyne receiver to have high sensitivity, the receiver must have a very narrow bandwidth.

Although it is desirable to have both the transmitter unit and the receiver unit of a remote convenience system operate at the same frequency, often their frequencies differ. The frequency difference for the transmitter and receiver units is due in part to component manufacturing tolerances, aging, and temperature induced variation. Typically, the maximum difference between the operating frequencies of the transmitter and receiver units is about 300 kHz. A superheterodyne receiver having a bandwidth that would encompass the possible difference (e.g., 300 kHz) would not provide suitable sensitivity.

SUMMARY OF THE INVENTION

In accordance with the present invention, a receiver/controller apparatus is provided for use in a remote convenience system. The receiver/controller apparatus is responsive to a function request transmitted by a portable transmitter for controlling performance of an associated function. Means of the apparatus receives a signal transmitted from the transmitter. The transmitted signal has a RF frequency, which is at an unknown valve within a range of values, and conveys a message that contains a function request. The means that receives the signal also provides a RF signal, which has the RF frequency and which conveys the message. Means provides a reference frequency signal.

Means mixes the RF signal and a reference frequency signal to provide an intermediate frequency signal conveying the message. The frequency of the intermediate frequency signal is at an unknown value within a known range of values. Means bandpass filters the intermediate frequency signal to pass a range of frequency values smaller than the known range of intermediate frequency values. The bandpass range has a center frequency.

Means automatically adjusts the center frequency of the bandpass range of the means for bandpass filtering to vary the bandpass range over the intermediate frequency range. Means senses the intermediate frequency signal passing through the means for bandpass filtering and automatically ceases adjustment of the center frequency of the bandpass range in response thereto. Means discerns the message from the filtered intermediate frequency signal. Means controls performance of the requested function of the message.

In accordance with another aspect of the present invention, a remote convenience system is provided for remote controlling performance of a function. The system includes portable transmitter means for remote control requests. The transmitter means includes means for transmitting a RF signal conveying a message, which contains a function request. The frequency of the RF signal being at an unknown value within a range of values.

The system includes receiver/controller means for receiving remote control requests and for controlling performance of the requested function. The receiver/controller means includes means for receiving the signal transmitted from the transmitter means and for providing a RF signal, which has the RF frequency and which conveys the message. Means provides a reference frequency signal. Means mixes the RF signal with the reference frequency signal to provide an intermediate frequency signal conveying the message. The frequency of the intermediate frequency signal is at an unknown value within a known range of values.

Means bandpass filters the intermediate frequency signal to pass a range of frequency values smaller than the known range of intermediate frequency values. The bandpass range has a center frequency. Means automatically adjusts the center frequency of the bandpass range of the means for bandpass filtering to vary the bandpass range over the intermediate frequency range. Means senses the intermediate frequency signal passing through the means for bandpass filtering and automatically ceases adjustment of the center frequency of the bandpass range in response thereto.

In accordance with another aspect, the present invention provides a method of receiving a function request transmitted by a portable transmitter for control of performance of a function. The method includes receiving a transmitted signal from the transmitter, the transmitted signal having a RF frequency at an unknown value within a range of values and conveying a message which contains a function request, and providing a RF signal having the RF frequency and conveying the message. A reference frequency signal is provided. The RF signal is mixed with the reference frequency signal to provide an intermediate frequency signal conveying the message. The frequency of the intermediate frequency signal is at an unknown value within a known range of values. The intermediate frequency signal is bandpass filtered to pass a range of frequency values smaller than the known range of intermediate frequency values. The bandpass range has a center frequency.

The center frequency of the bandpass range is automatically adjusting to vary the bandpass range over the intermediate frequency range. The passage of the intermediate frequency signal through the bandpass is sensed and the automatic adjustment of the center frequency of the bandpass range is ceased in response thereto. The message is discerned from the filtered intermediate frequency signal. Performance of the requested function of the message is controlled.

In accordance with another aspect, the present invention provides a method of remote control performance of a function. The method includes transmitting a RF signal conveying a message, which contains a function request. The frequency of the RF signal is at an unknown value within a range of values. The transmitted RF signal is received and a RF signal that has the RF frequency and conveying the message is provided. A reference frequency signal is provided. The RF signal is mixed with the reference frequency signal to provide an intermediate frequency signal conveying the message. The frequency of the intermediate frequency signal is at an unknown value within a known range of values. The intermediate frequency signal is bandpass filtered to pass a range of frequency values smaller than the known range of intermediate frequency values. The bandpass range has a center frequency.

The center frequency of the bandpass range is automatically adjusted to vary the bandpass range over the intermediate frequency range. Passage of the intermediate frequency signal through the bandpass is sensed and the automatic adjustment of the center frequency of the bandpass range is ceased in response thereto. The message is discerned from the filtered intermediate frequency signal. Performance of the requested function of the message is controlled.

BRIEF DESCRIPTION OF THE DRAWINGS

The foregoing and other features and advantages of the present invention will become apparent to those skilled in the art to which the present invention relates from a reading of the following detailed description of the preferred embodiments with reference to the accompanying drawings, in which.

DESCRIPTION OF PREFERRED EMBODIMENTS

Figure 1:
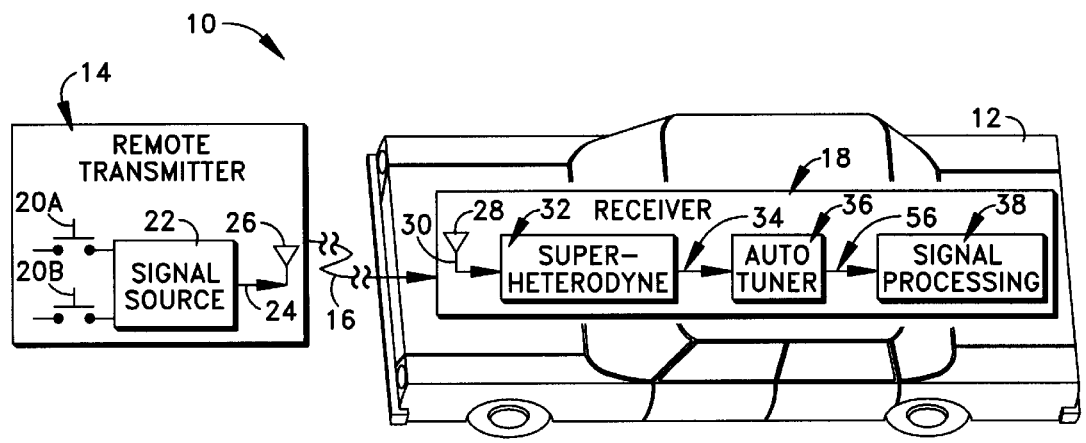
FIG. 1 is a schematic illustration of a remote convenience vehicle system associated with a vehicle and containing an apparatus in accordance with the present invention.

One preferred embodiment of a remote convenience vehicle system 10 in accordance with the present invention is schematically shown in FIG. 1, along with an associated vehicle 12. The system 10 described herein includes one or more remote transmitter units 14 that communicate, via an electromagnetic command signal 16, with a vehicle-mounted receiver/controller unit 18 to achieve remote control of at least one vehicle system. Hereinafter, the receiver/controller unit is referred to simply as the receiver unit.

Preferably, each transmitter unit 14 can transmit any of a plurality of command signals 16 to the receiver unit 18. Each command signal 16 is a broadcast signal and conveys a security code and a message that requests performance of a certain vehicle function. Upon receipt of an authorized command signal 16 by the receiver unit 18, the receiver unit provides the function-request message to an appropriate vehicle system control means.

An example of a vehicle system that has remotely controllable functions is a power door lock system that locks and unlocks one or more vehicle doors. Another example of a vehicle system that has remotely controllable functions is a trunk release system that releases a trunk latch mechanism. Yet another example of a remotely controllable vehicle function is what is referred to as a vehicle-find function. Specifically, the vehicle's horn and/or lights are actuated to identify the location of the vehicle for the transmitter unit operator (e.g., the vehicle owner), who is located at a distance from the vehicle. It will be appreciated that other embodiments of the present invention may have other remotely controlled functions (e.g., garage door opening, entry light activation).

Focusing now on the one or more transmitter units 14, all of the transmitter units for a specific system are structurally similar. Thus, only one transmitter unit 14 is described herein for the example system 10. The transmitter unit 14 is a portable, hand-held unit. The transmitter unit 14 includes at least one manually operable pushbutton switch 20. In the example shown in FIG. 1, there are two pushbutton switches 20A, 20B. Each pushbutton switch 20 is connected to a signal source circuitry 22. Each actuation, or predefined series of actuations, of one of the pushbutton switches 20 corresponds to a predefined remote function request. In response to the pushbutton actuation, the signal source circuitry 22 provides an appropriate electrical signal 24 to an antenna 26 of the transmitter unit 14. The antenna 26, in turn, emits the signal 16.

The signal 16 is a serially transmitted, digital signal that is broadcast. The signal 16 has a carrier frequency that is also referred to as the operating frequency of the transmitter unit 14. Preferably, the carrier frequency is in the ultrahigh frequency (UHF) frequency range of the radio frequency (RF) spectrum. In one preferred embodiment, the carrier frequency is 315 MHz. Also, preferably, the signal 16 is pulse-width modulated to represent the binary 1 and the binary 0.

At this point it is stated that the remote transmitter unit 14 is designed to have a relatively low transmission power level. For example, in the United States, the remote transmitter unit 14 is operating at or below the power threshold for unlicensed transmission devices, as designated by the United States Federal Communications Commission (FCC). Further, it is noted as being desirable for the receiver unit 18 to receive the transmitted signal 16 for the scenario in which the transmitter unit 14 and the receiver unit 18 are spaced apart a relatively great distance.

Focusing now on the receiver unit 18, an antenna 28 of the receiver unit receives the transmitted signal 16. The antenna 28 outputs an electrical signal 30 to superheterodyne circuitry 32. The signal 30 has the same characteristics as the signal 16, in that the signal 30 has the same UHF frequency as the signal 16 and is pulse width modulated to convey the information contained within the signal 16. The superheterodyne circuitry 32 "converts" the UHF frequency associated with the transmitted signal 16 to an intermediate frequency (IF). An output signal 34 from the superheterodyne circuitry 32 is at the IF frequency and conveys the information of the signal 16 (i.e., the security code and message).

In order for the receiver unit 18 to complete processing of the received signal 16, the output signal 34 from the superheterodyne circuitry 32 must be at or very near a specific IF frequency. The IF frequency is related to a specific UHF frequency. The specific UHF frequency is referred to as the operating UHF frequency of the receiver unit 18. The operating UHF frequency of the receiver unit 18 must be substantially identical to the frequency of the signal 16. In other words, the operating UHF frequencies of the transmitter and receiver units 14, 18 must substantially match.

In order to accomplish a matching of the two operating frequencies, the output signal 34 from the superheterodyne circuitry 32 is provided to automatic tuner circuitry 36. The automatic tuner circuitry 36 functions to automatically make an adjustment within the receiver unit 18, in accordance with the present invention. The operating frequency of the receiver unit is matched to that of the transmitted signal 16 (i.e., the tuner circuitry 36 automatically adjusts the operating frequency of the receiver unit 18 to "accept" the signal 16 at the frequency at which it was transmitted).

The automatic tuner circuitry 36 operates such that the receiver unit 18 can discern the transmitted signal 16 from the remote transmitter unit 14 with a high level of sensitivity. Specifically, the automatic tuner circuitry 36 functions to focus the receiver unit's capabilities to a relatively narrow bandwidth, thus improving the receiver unit's sensitivity for receiving the relatively low power transmitted signal 16. Once the automatic tuner circuitry 36 adjusts the operating frequency of the receiver unit 18 to the frequency of the signal 16, the information contained within the received signal 16 is processed, via signal processing circuitry 38 to verify the security code and to accomplish the requested function.

Figure 2:
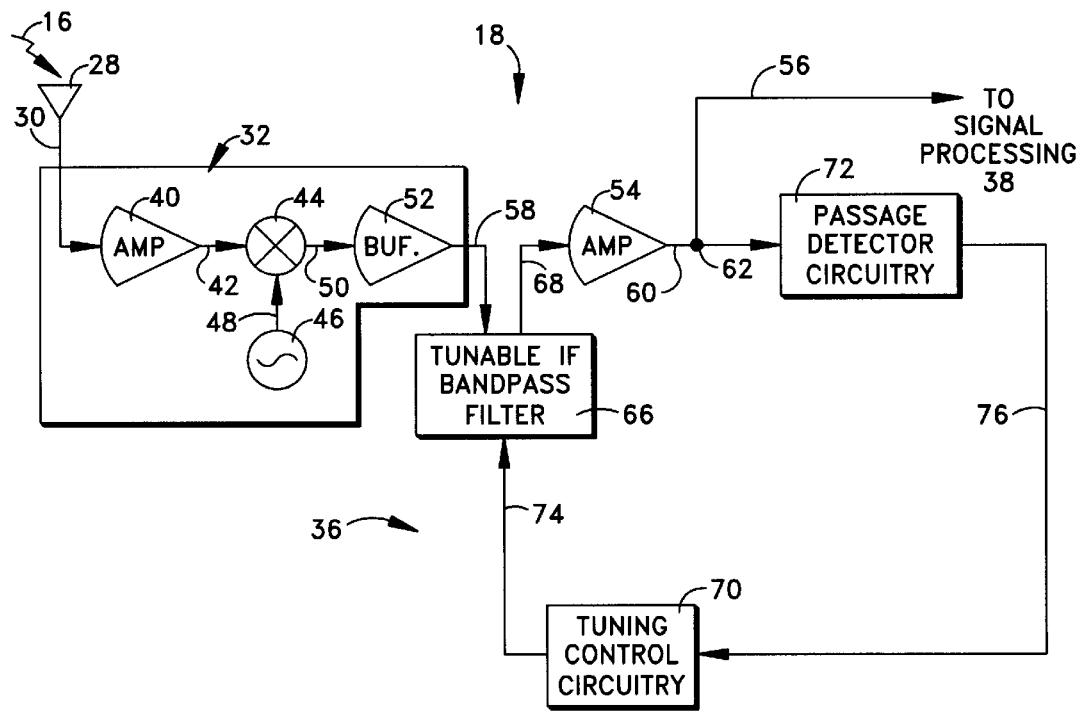
FIG. 2 is a schematic circuit diagram of a receiver unit shown in FIG. 1 and in accordance with the present invention.

Turning now to the specifics of the receiver unit 18 shown in FIG. 2, the superheterodyne circuitry 32 includes a front end amplifier 40 which receives the signal 30 output from the antenna 28. An output signal 42 of the amplifier 40 is provided as a first input to a mixer 44. A local or reference oscillator 46 provides an oscillating signal 48 at a reference frequency that is intended to be a selected value. In one example, the reference frequency is 314.555 MHz. The signal 48 provided by the reference oscillator 46 is a second input of the mixer 44.

The mixer 44 combines the two input signals 42,48, and outputs a signal 50 having frequency component values that are at the sum and difference of the frequency values of the two input signals 42,48. In other words, the mixer 44 "beats" the first input signal 42 with the second input signal 48. The "difference frequency" value is the IF frequency. The "sum frequency" is ignored. The receiver unit 18 includes a buffer 52 and an amplifier 54 for handling the IF frequency signal 50 output from the mixer 44 along a path 56 toward the signal processing circuitry 38. The buffer 52 receives the signal 50 from the mixer 44, and provides an output 58. The amplifier 54 is downstream of the buffer, and provides an output 60, which is supplied to the path 56 toward the signal processing circuitry 38 at a node 62.

In the preferred embodiment, with the operating (carrier) frequency of the transmitter unit 14 at 315 MHz and the reference oscillator frequency at 314.555 MHz, the intermediate frequency is 455 KHz. However, due to various factors such as manufacturing tolerances, aging and temperature, the carrier frequency of the transmitted signal 16 may vary over a range away from its intended value. In one example, in which the intended transmitted frequency is at 315 MHz, the actual frequency may vary +/−100 kHz. Also, the reference frequency of the oscillator signal 48 may vary because of various factors such as manufacturing tolerances, aging and temperature. For example, with the intended reference frequency at 314.555 MHz, the actual reference frequency may vary +/−100 kHz. Accordingly, the intermediate frequency output by the mixer 44 may vary quite a bit. Specifically, in one example, the intermediate frequency may be 455 kHz +/−200 kHz. Thus, the person of ordinary skill in the art will appreciate the extended possible range of the intermediate frequency output by the mixer 44.

The automatic tuner circuitry 36 includes a tunable bandpass filter 66 which has an adjustable bandpass range for "matching" the operating UHF frequency of the receiver unit 18 to the operating frequency of the transmitter unit 14 via selective passage of the IF frequency signal generated by the mixer 44. Specifically, the center frequency of the bandpass is adjusted until the operating frequency of the transmitter passes through the bandpass filter 66. The range of frequencies passed by the bandpass filter 66 is a relatively narrow range of IF frequencies. The bandpass filter 66 is interposed along the path 56 toward the signal processing circuitry 38. Preferably, the bandpass filter 66 is located between the buffer 52 and the amplifier 54, such that the bandpass filter receives the signal 58 from the buffer 52 and provides a filtered signal 68 to the amplifier 54.

In order to automatically adjust the tunable bandpass filter 66, the automatic tuner circuitry 36 includes tuning control circuitry 70 and passage detector circuitry 72. The tuning control circuitry 70 provides a control signal 74 to the bandpass filter 66 to adjust or tune the bandpass of the tunable bandpass filter over a predetermined range of possible intermediate frequencies. The signal is automatically changed or varied to automatically vary the bandpass over the range. This adjustment process is repeated. In other words, the possible range of IF frequencies is repeatedly "swept" in search of an IF frequency signal created by the mixer 44 and output from the superheterodyne circuitry 32.

The passage detector circuitry 72 is connected to the node 62 to receive the output 60 of the amplifier 54. The passage detector circuitry 72 monitors whether the bandpass filter 66 passes a particular IF frequency signal. A signal 76 that is indicative of the passage of a particular IF frequency signal through the bandpass filter 66 is provided to the turning control circuitry 70. When an intermediate frequency signal passes through the tunable bandpass filter 66, the signal 76 causes the tuning control circuitry 70 to cease the adjustment and "lock" the bandpass filter onto the IF frequency which is passing through the bandpass filter.

The passage detector circuitry 72 and the tuning control circuitry 70 include means for resetting and resuming the adjustment once the reception of the signal 16 is complete. Preferably, a short delay occurs before the reset/resume occurs, in order to await a subsequent signal 16.

Preferably, the bandpass of the bandpass filter 66 is dependent upon the voltage value of the control signal 74. Thus, the bandpass filter 66 has a voltage-controlled device and the control signal 74 has a dc voltage value that is changed to adjust the bandpass.

Figure 3:
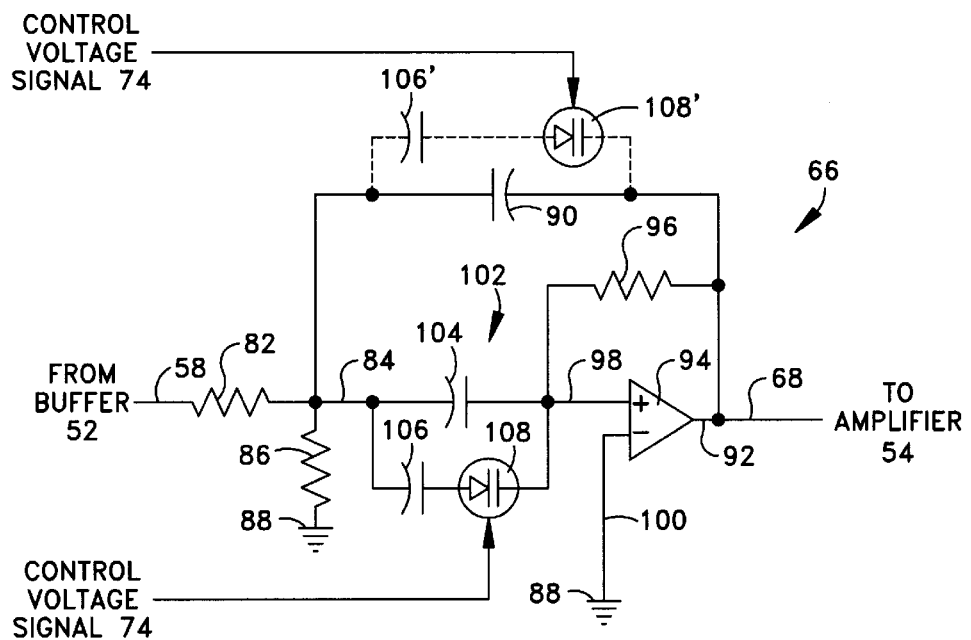
FIG. 3 is a schematic circuit diagram showing a tunable filter within the receiver unit of FIG. 2.

One example configuration of the bandpass filter 66 is shown in FIG. 3. The bandpass filter 66 has a first resistor 82 connected to receive the output 58 of the buffer 52. The first resistor 82 is also connected to a node 84. A second resistor 86 is connected between the node 84 and electrical ground 88.

A first capacitor 90 is connected between the node 84 and an output 92 of an amplifier 94. The output 92 of the amplifier 94 amplifies the output signal 68 from the bandpass filter 66. A third resistor 96 is connected between a first input 98 of the amplifier 94 and the amplifier output 92. A second input 100 of the amplifier 94 is connected to ground 88. Connected between the node 84 and the first amplifier input 98 is a capacitor circuit arrangement 102.

The capacitor circuit arrangement 102 includes a second capacitor 104 of the bandpass filter 66. The second capacitor 104 is connected between the node 84 and the first amplifier input 98. The capacitor circuit arrangement 102 also includes a third capacitor 106 of the bandpass filter 66, and a varactor 108, which are in series between the node 84 and the first amplifier input 98. The third capacitor 106 and the varactor 108 are in parallel with the second capacitor 104. The control signal 74 from the tuning control circuitry 70 is provided as a control input to the varactor 108. A capacitance value of the varactor 108 is dependent upon the voltage of the control signal 74.

In this example, the cutoff frequency of the bandpass filter 66 is represented by the equation:

$$f_c = \frac{1}{2\pi C} \sqrt{\frac{R_1 + R_2}{R_1 R_2 R_3}}$$

wherein:
 $f_c$=frequency of the bandpass filter 66;
 C=capacitance of the capacitor circuit arrangement 102;
 $R_1$=resistance value of first resistor 82;
 $R_2$=resistance value of second resistor 86; and
 $R_3$=resistance value of third resistor 96.

The capacitance value C is dependent upon the capacitance of the varactor 108. The capacitance C is represented by the equation:

$$C = C_2 + \frac{C_3 C_v}{C_3 + C_v}$$

wherein:
 $C_2$=capacitance value of second capacitor 104;
 $C_3$=capacitance value of third capacitor 106; and
 $C_v$=capacitance value of varactor 108.

Note that FIG. 3 also shows optional capacitor 106' and varactor 108' (phantom connection shown), that are connected in series with each other, and that are connected in parallel with the capacitor 90. The varactor 108' is controlled by the control voltage signal 74. The capacitor 106' and varactor 108' help "balance" the bandpass filter 66, and their use is preferred.

Figure 4:
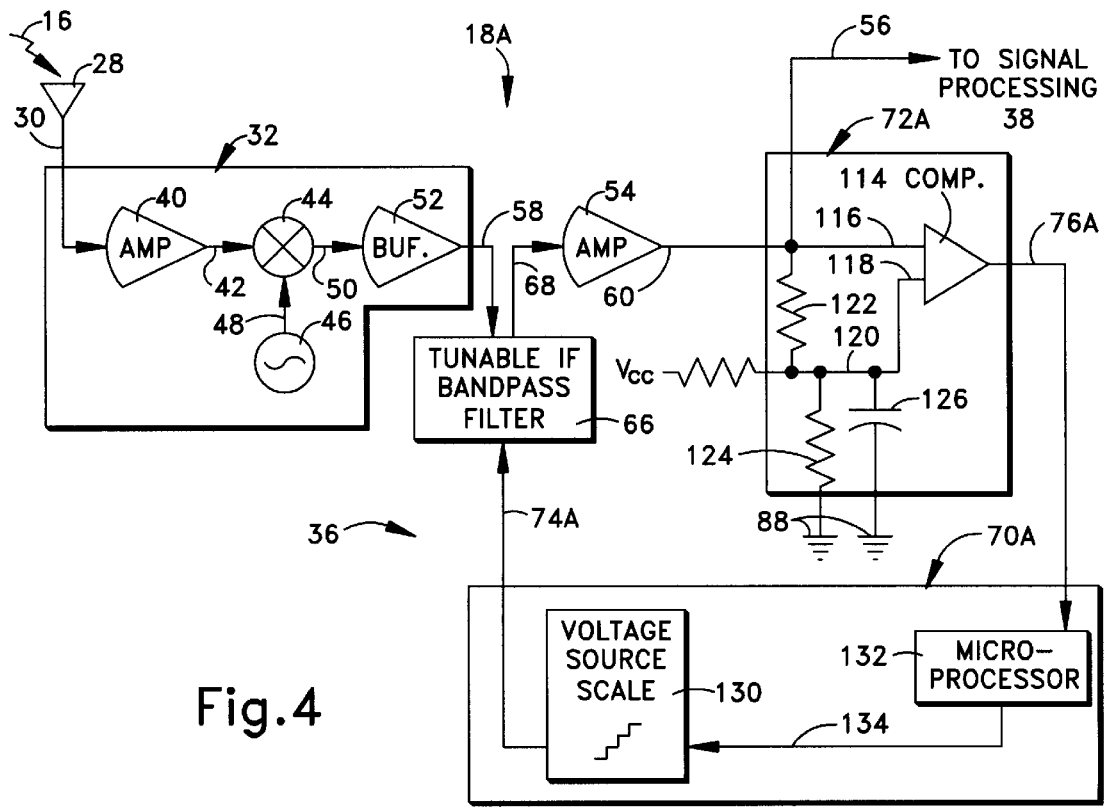
FIG. 4 is a circuit diagram showing details of a first embodiment of the receiver unit.

Attention is now directed to FIG. 4 which shows a first specific receiver unit embodiment of the invention. The receiver unit of FIG. 4 is designated 18A and illustrates first specific examples of the tuning control circuitry and the passage detector circuitry. In the embodiment of FIG. 4, structure that is identical to structure shown in FIG. 2 is identified by the same reference numerals. The tuning control circuitry and the passage detector circuitry have embodiment-specific structure and are identified by the alphanumeric designations 70A and 72A, respectively.

The passage detector circuitry 72A includes a comparator 114. An output of the comparator 114 is the signal 76A. A first input 116 of the comparator 114 is connected to the output 60 of the amplifier 54. A second input 118 of the comparator 114 is connected to a reference node 120, which is in turn connected to a reference voltage source $V_{cc}$. Connected between the first and second comparator inputs 116 and 118 is a first resistor 122. A second resistor 124 and a capacitor 126 are connected, in parallel, between the reference node 120 (i.e., the second comparator input 118) and ground 88.

The comparator 114 monitors the output 60 of the amplifier 54, which has a noise component that is characterized as having a dc value with an ac value added to the dc value. The output 60 of the amplifier 54 consists of only the noise when the intermediate frequency created by the mixer 44 of the superheterodyne circuitry 32 does not pass through the bandpass filter 66. For this situation, the voltage at the first input 116 of the comparator 114 is less than the voltage at the second input 118 of the comparator 114. The comparator 114 outputs the signal 76A to have a digital "LOW" value. When the intermediate frequency signal created by the mixer 44 of the superheterodyne circuitry 32 passes through the bandpass filter 66, the voltage of the first comparator input 116 exceeds the voltage at the second comparator input 118, and the comparator 114 outputs the signal 76A to have a digital "HIGH" value.

The tuning control circuitry 70A of the embodiment shown in FIG. 4 controls the voltage of the control signal 74A provided to the tunable bandpass filter 66. The tuning control circuitry 70A includes voltage source scale circuitry 130 and a microprocessor 132. The voltage source scale circuitry 130 provides the control signal 74A, which has a voltage that has a stair-stepped characteristic. Specifically, the voltage of the control signal 74A is adjustable to one of a plurality of discrete voltage levels. The voltage source scale circuitry 130 is controlled by a control signal 134 provided by the microprocessor 132. Of course, a person of ordinary skill in the art will appreciate that a voltage source with a "ramped" output could be used.

The possible range of the intermediate frequency that will pass through the bandpass filter 66 is predetermined to extend from a first or lower intermediate frequency $IF_1$ to a second or upper intermediate frequency $IF_2$. The range $IF_1$ to $IF_2$ is greater than the bandwidth $\Delta f$ of the bandpass filter 66 at each adjustment setting of the bandpass filter. Hence, adjustment of the bandwidth $\Delta f$ is necessary to cover the range $IF_1$ to $IF_2$.

During the adjustment process, the microprocessor 132 provides the signal 134 to control the voltage source scale circuitry 130 to vary voltage of the control signal 74A. For each round of adjustments, the bandpass filter 66 initially provides a bandwidth that includes $IF_1$, and steps towards a bandwidth that includes $IF_2$. The control by the microprocessor 132 to cause adjustment of the control signal 74A output by the voltage source scale circuitry 130 is continuously repeated so long as the tunable bandpass filter 66 does not pass an intermediate frequency signal. Specifically, the microprocessor 132 causes the bandpass frequency adjustment to continue so long as the output signal 76A of the comparator 114 has a digital LOW value.

The LOW signal value from the comparator 114 occurs while the receiver unit 18A is awaiting a transmitted signal 16. Also, the LOW signal value from the comparator 114 occurs as a transmitted signal starts to be received and yet the tunable bandpass filter does not pass the IF frequency signal created by the mixer 44 of the superheterodyne circuitry 32. However, when the receiver unit 18A receives a transmitted signal 16, and the control signal 74A causes the bandpass filter 66 to pass a range of frequencies which include the intermediate frequency provided by the mixer 44, the output signal 76A of the comparator 114 goes HIGH. In response to the digital HIGH signal 76A, the microprocessor 132 controls the voltage source scale circuitry 130 to hold its control signal 74A at the present voltage level. This "locks" the bandpass of the bandpass filter 66 at a relatively narrow range, which permits passage of the intermediate frequency signal created by the mixer 44 of the superheterodyne circuitry 32.

In order to assure that all possible intermediate frequencies in the range $IF_1$ to $IF_2$ are covered during adjustment via the control signal 74A, at least $$\frac{IF_2 - IF_1}{\Delta f}$$

steps of control voltage is required. This allows the intermediate frequency signal created by the mixer 44 to pass through the bandpass filter 66 one time during each adjustment repetition (i.e., stair-step adjustment from lowest to highest voltage levels provided by the voltage source scale circuitry 130).

As a possible alternative in the embodiment of FIG. 4, a greater number of voltage steps can be used to adjust the voltage level between the lowest and highest voltage levels. If a greater number of voltage levels are used, it is possible that the intermediate frequency signal created by the mixer 44 will pass through the bandpass filter 66 for more than one voltage level. For example, if the minimum required number of voltage levels (i.e., $$\left(i.e., \frac{IF_2 - IF_1}{\Delta f}\right)$$

is multiplied by N, the intermediate frequency signal will pass through the bandpass filter 66 for N voltage steps.

If the number of voltage steps is increased as a multiple of N, the microprocessor 132 includes a function which stores information regarding which of the voltage steps are associated with passage of the intermediate frequency signal through the bandpass filter 66. The microprocessor 132 does not immediately "lock" the voltage source scale circuitry 130 upon the passage of the intermediate frequency signal through the bandpass filter 66 for a voltage step. Instead, the microprocessor 132 waits for the comparator output signal 76A to go LOW, and determines the average or center voltage level of all of the voltage levels which permitted passage of the intermediate frequency signal. Once the microprocessor 132 determines the center voltage level, the microprocessor provides the signal 134 instructing the voltage source scale circuitry 130 to locked the control signal 74A at the determined center voltage level. This allows for finer adjustment of the bandpass filter 66, to center the intermediate frequency in the bandpass of the bandpass filter.

Figure 5:
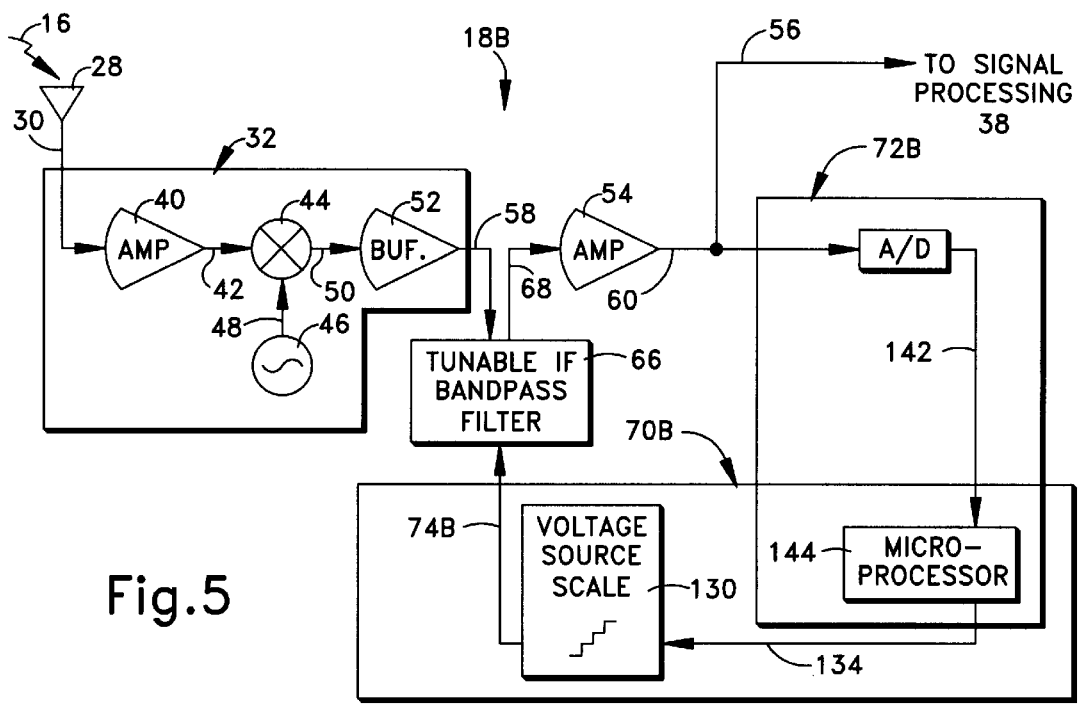
FIG. 5 is a circuit diagram showing details of a second embodiment of the receiver unit.

FIG. 5 illustrates an embodiment of the receiver unit that is designated 18B. In the embodiment of FIG. 5, the tuning control circuitry and the passage detector circuitry are identified by the alphanumeric designations 70B and 72B, respectively. Further, structure that is identical to structure of the previously described embodiments is identified by the same reference numerals as used for the previous described embodiments.

The receiver unit 18B of FIG. 5 is similar to the receiver unit 18A of FIG. 4, but shows an alternative to the comparator 114 of the passage detector circuitry 72A of the embodiment of FIG. 4. Specifically, the embodiment in FIG. 5 includes an analog-to-digital (A/D) converter 140 as part of the passage detector circuitry 72B, which is connected to receive the output signal 60 of the amplifier 54. The A/D converter 140 provides a digital output signal 142 to a microprocessor 144. The voltage value of the signal 142 is indicative of the signal 68 output from the bandpass filter 66 (i.e., the voltage value is indicative of whether the IF frequency signal created by the mixer 44 of the superheterodyne circuitry 32 passes through the bandpass filter).

The microprocessor 144 of FIG. 5 is different from the microprocessor 132 of FIG. 4. In the embodiment of FIG. 5, the microprocessor 144 is part of the tuning control circuitry 70B and part of the passage detection circuitry 72B. As part of the passage detection circuitry 72B, the microprocessor 144 of FIG. 5 monitors the digital signal 142 and compares the value of the digital signal 142 to a predetermined threshold value. When the voltage indicative value of the digital signal 142 is below the predetermined threshold, the microprocessor 144 controls the voltage source scale circuitry 130 to adjust the control signal 74B and cause adjustment of the bandpass of the bandpass filter 66. When the value of the digital signal 142 exceeds the predetermined threshold value, the microprocessor 144 continues to cause adjustment of the bandpass, but also waits for the digital signal to reach a peak and beings to drop. The microprocessor 144 then controls the voltage control circuitry 130 to lock the control signal 74B at the peak voltage level.

Figure 6:
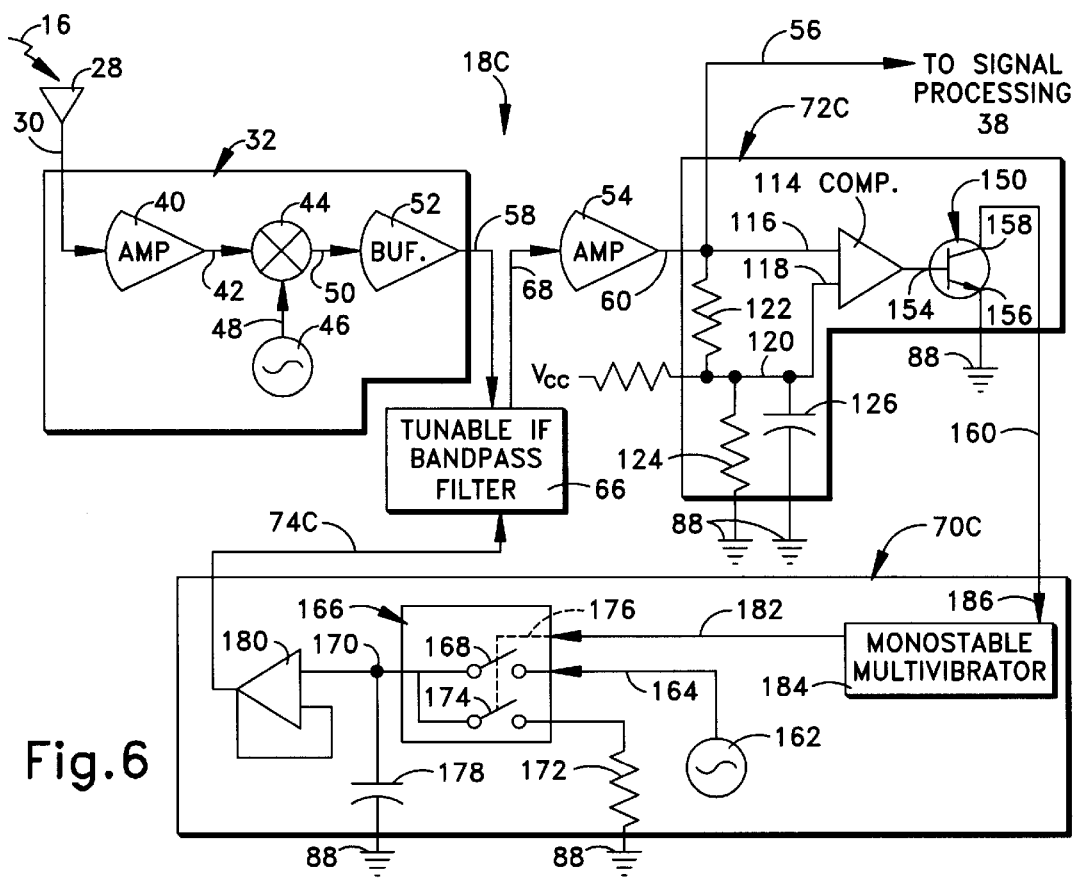
FIG. 6 is a circuit diagram showing details of a third embodiment of the receiver unit.

FIG. 6 illustrates an embodiment of the receiver unit that is designated 18C. In the embodiment of FIG. 6, the tuning control circuitry and the passage detector circuitry are identified by the alphanumeric designations 70C and 72C, respectively. Further, structure that is identical to structure of the previously described embodiments is identified by the same reference numerals as used for the previous described embodiments.

The embodiment shown in FIG. 6 is similar to the embodiment shown in FIG. 4, but has alternative elements for its passage detector circuitry 72C and its tuning control circuitry 70C. Specifically, the passage detector circuitry 72C of FIG. 6, has a comparator circuit arrangement (i.e., comparator 114, resistors 122, 124, and capacitor 126) identical to the comparator circuit arrangement of the passage detector circuitry 72A of FIG. 4.

In addition, the passage detector circuitry 72C (FIG. 6) has a NPN transistor 150. The output 152 of the comparator 114 is provided to a base terminal 154 of the NPN transistor 150. An emitter terminal 156 of the transistor 150 is connected to ground 88 and a collector terminal 158 is connected to line 160 extending the tuning control circuitry 70C.

Accordingly, when the intermediate frequency signal generated by the mixer 44 of the superheterodyne circuitry 32 does not pass through the bandpass filter 66, the line 160 to the tuning control circuitry 70C is disconnected from electrical ground 88. However, when the intermediate frequency signal generated by the mixer 44 passes through the bandpass filter 66, the line 160 to the tuning control circuitry 70C is connected to electrical ground 88. Thus, the signal provided on the line goes LOW when the IF frequency signal passes through the bandpass filter 66.

The tuning control circuitry 70C includes a low frequency signal generator 162. The voltage of an output signal 164 of the signal generator 162 changes over a predetermined range. In one embodiment, the voltage "sweeps" through the predetermined range from a start voltage to an end voltage, and then repeats (i.e., the voltage has a saw-tooth pattern). The output signal 164 of the signal generator 162 is provided as an input to a switch box 166. The output of the signal generator 162 is connectable, via a switch 168 within the switch box 166, to a node 170.

A resistor 172 is connected between an input of the switch box 166 and ground 88. The resistor 172 is connectable to the node 170, via a switch 174 of the switch box 166. The two switches 168 and 174 are represented in the drawings as schematic switches. However, the switches 168 and 174 may be any suitable switching devices. The switches 168 and 174 are configured such that they are both closed or opened concurrently. The concurrent control configuration is schematically shown in FIG. 6 by a dash line 176.

A capacitor 178 is connected between the node 170 and ground 88. A unity gain voltage follower 180 is connected between the node 170 and the bandpass filter 66. The amplifier acts to isolate the node 170 from the input of the bandpass filter 66.

The output of the voltage follower 180 is the control signal 74C. When the switches 168 and 174 of the switch box 166 are closed, the voltage at the control node 170, and hence the voltage of the control signal 74C, follows the output signal 164 from the signal generator 162.

When the switches 168 and 174 of the switch box 166 are opened, the signal generator 162 and the resistor 172 are disconnected from the node 170. The voltage follower 180 continues to output the control signal 74C, and the voltage value of the control signal 74C stays constant for a period of time. Specifically, the input impedance of the voltage follower 180 and the capacitor 178 define a RC circuit. The input impedance of the voltage Follower is high, and thus, the time constant of the RC circuit is relatively large. The voltage of the control signal 74C stays constant due to the large time constant.

The switches 168 and 174 of the switch box 166 are controlled via a signal 182 from a monostable multivibrator 184. The multivibrator 184 has an input terminal 186 connected to the line 160 extending to the collector terminal 158 of the NPN transistor 150. When the transistor 150 turns ON, the input terminal 186 of the multivibrator 184 is connected to ground 88 (i.e., the voltage at the input terminal goes LOW). The connection of the input terminal 186 to ground is referred to as a wake-up signal. Prior to the multivibrator 184 receiving the wake-up signal, the signal 182 causes the switches to be closed. In response to the wake-up signal, the multivibrator 184 provides the signal such that the switches 168 and 174 are opened.

The switches 168 and 174 are held open for a period of time, via the signal 182 from the multivibrator 184. The period of time is predetermined. Upon expiration of the predetermined time period, the switches 168 and 174 are again closed, and adjustment of the voltage of the control signal 74C resumes.

Figure 7:
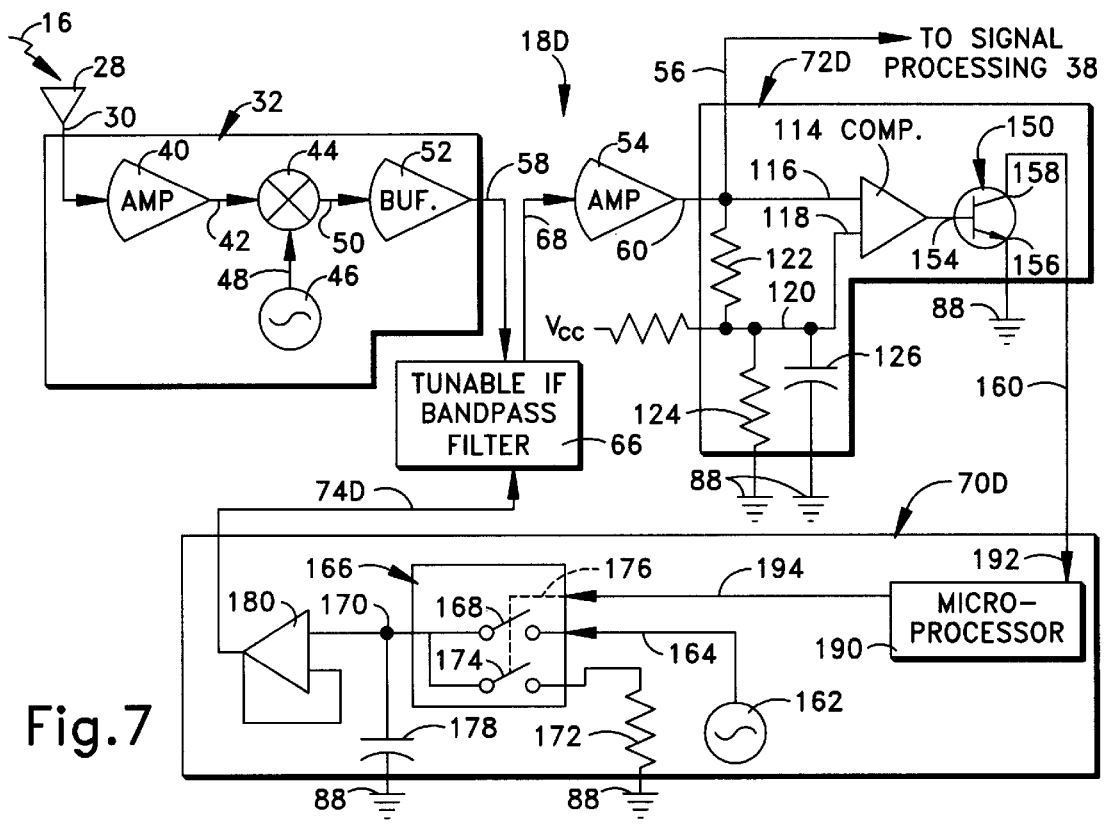
FIG. 7 is a circuit diagram showing details of a fourth embodiment of the receiver unit.

FIG. 7 illustrates an embodiment of the receiver unit that is designated 18D. In the embodiment of FIG. 7, the tuning control circuitry and the passage detector circuitry are identified by the alphanumeric designations 70D and 72D, respectively. Further, structure that is identical to structure of the previously described embodiments is identified by the same reference numerals as used for the previous described embodiments.

The embodiment shown in FIG. 7 is similar to the embodiment shown in FIG. 6, but has alternative structure for its tuning control circuitry 70D. Specifically, the embodiment of FIG. 7 has a microprocessor 190 instead of the multivibrator 184 of the embodiment of FIG. 6. An input terminal 192 of the microprocessor 190 is connected to the line 160 extending from the collector terminal 158 of the NPN transistor 150. The microprocessor 190 is connected to provide a control signal 194 as an input to the switch box for controlling the switches 168 and 174.

When the intermediate frequency signal created by the mixer 44 of the superheterodyne circuitry 32 passes through the bandpass filter 66, the output of the comparator goes HIGH and the transistor turns ON. The input terminal 192 is connected to ground through the transistor 150. The microprocessor 190 monitors the voltage at the terminal 192. The "grounding" of the terminal 192 provides a "wakeup" signal for the microprocessor 190. In response to this wakeup signal, the microprocessor 190 provides the signal 194 such that the switches 168 and 174 of the switch box 166 are opened. The switches 168 and 174 are held open while the terminal 192 is grounded (i.e., while the IF frequency signal 50 created by the mixer 44 passes through the bandpass filter 66).

When the transmitted signal 16 ceases, the intermediate frequency signal generated by the mixer 44 ceases. The output of the comparator 114 goes LOW and the transistor 150 turns OFF. The terminal 192 of the microprocessor 190 is disconnected from ground 88. In response to this disconnection from ground, the microprocessor waits for a predetermined delay time and then provides the signal such that the switches 168 and 174 close. The adjustment of the control signal 74C resumes. Thus, the receiver unit 18D is ready to lock-in on the next transmitted signal 16.

Figure 8:
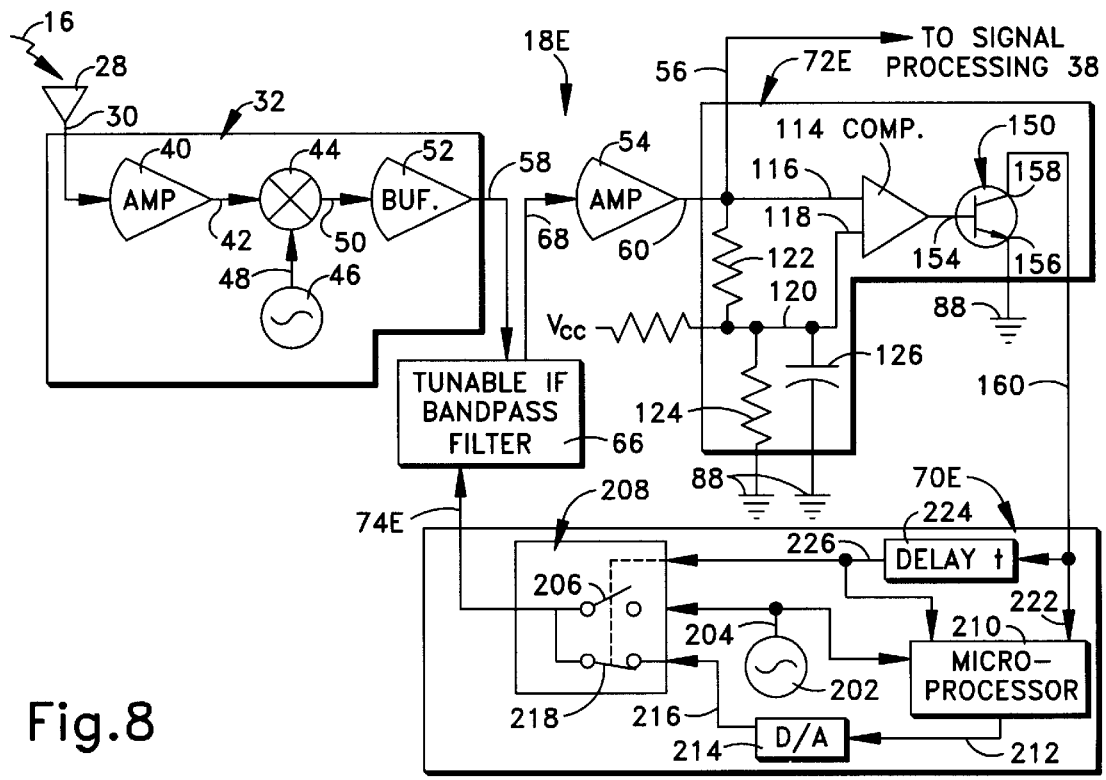
FIG. 8 is a circuit diagram showing details of a fifth embodiment of the receiver unit.

FIG. 8 illustrates an embodiment of the receiver unit that is designated 18E. In the embodiment of FIG. 8, the tuning control circuitry and the passage detector circuitry are identified by the alphanumeric designations 70E and 72E, respectively. Further, structure that is identical to structure of the previously described embodiments is identified by the same reference numerals as used for the previous described embodiments.

The embodiment shown in FIG. 8 is similar to the embodiment shown in FIG. 7. Specifically, the passage detector circuitry of the embodiment shown in FIG. 8 is identical to the embodiment of FIG. 7. However, the tuning control circuitry 70E of the embodiment of FIG. 8 is different.

The tuning control circuitry 70E includes a low frequency signal generator 202, which provides an oscillating output signal 204, similar to the signal generator 162 of the embodiment of FIG. 6. The output signal 204 is provided, via a first switch 206 of a switch box 208, as the control signal 74E for the bandpass filter 66. When the first switch 206 is closed, the bandpass of the bandpass filter 66 is changed based upon the voltage provided by the signal generator 202.

The output signal 204 of the signal generator 202 is also provided to a microprocessor 210 of the tuning control circuitry 70E. The microprocessor 210 monitors the voltage of the output signal 204. An output 212 of the microprocessor 210 is a digital signal indicative of the voltage of the signal generator output signal 204. The digital output signal 212 from the microprocessor 210 is provided to a digital-to-analog (D/A) converter 214. An analog signal 216 provided by the D/A converter 214 has a voltage dependent upon the digital signal 212 provided by the microprocessor 210.

The output of the D/A converter 214 is connected to a second switch 218 of the switch box 208. The first and second switches 206, 218 are configured such that when the first switch 206 is closed, the second switch 218 is opened, and when the first switch 206 is opened, the second switch 218 is closed. The output signal 216 is the control signal 74E for the bandpass filter 66 when the second switch 218 is closed.

The microprocessor 210 has an input terminal 222 connected to the line 160 extending to the collector terminal 158 of the transistor 150. Also, delay circuitry 224 is connected to the line 160. The delay circuitry 224 provides a control signal 226 to the switch box 208 to control operation of the switches 206, 218. When the transistor 150 is OFF (i.e., an IF frequency signal created by the mixer of the superheterodyne circuitry 32 is not passing through the bandpass filter 66 and the comparator output is LOW), the delay circuitry 224 provides the signal 226 such that the first switch 206 is closed and the second switch 218 is open. The bandpass of the bandpass filter 66 is progressively adjusted via the control signal 74E provides by the signal generator 202.

When the intermediate frequency signal created by the mixer 44 passes through the bandpass filter 66, the output of the comparator 114 goes HIGH and the transistor 150 turns ON. The wakeup signal is provided both to the delay circuitry 224 and the microprocessor 210. In response to the wakeup signal, the microprocessor 210 "locks" the digital value provided to the D/A converter 214. Accordingly, the voltage of the output signal 216 remains at a constant value.

Also in response to the wake-up signal, the delay circuitry 224 provides the signal 226 such that the switches are toggled. The first switch 206 of the switch box 208 is opened and the second switch 218 is closed. The signal generator 202 is disconnected from the bandpass filter 66 and the D/A converter 214 is connected to provide the control signal 74E to the bandpass filter 66. Accordingly, the bandpass of the bandpass filter 66 is held constant.

Once the predetermined time period associated with the delay circuitry 224 expires, the delay circuitry 224 provides the signal 226 such that the first switch 206 closes and the second switch 218 opens. Also, the microprocessor 210 is reset such that the microprocessor resumes providing the digital signal 212 to the D/A converter that is indicative of the voltage of the output signal 204 of the signal generator 202.

From the above description of the invention, those skilled in the art will perceive improvements, changes and modifications. Such improvements, changes and modifications within the skill of the art are intended to be covered by the appended claims.

Having described the invention the following is claimed:

1. A receiver/controller apparatus for a remote convenience system, said apparatus being responsive to a function request transmitted by a portable transmitter for controlling performance of an associated function, said apparatus comprising:

means for receiving a signal, transmitted from the transmitter, which has a RF frequency, at an unknown value within a range of values, and which conveys a message that contains the function request, and for providing a RF signal having the RF frequency and conveying the message;

means for providing a reference frequency signal;

means for mixing the RF signal with the reference frequency signal to provide an intermediate frequency signal conveying the message, the frequency of the intermediate frequency signal being at an unknown value within a known range of values;

means for bandpass filtering the intermediate frequency signal to pass a range of frequency values smaller than the known range of intermediate frequency values, the bandpass range having a center frequency;

means for automatically adjusting the center frequency of the bandpass range of said means for bandpass filtering to vary the bandpass range over the intermediate frequency range;

means for sensing the intermediate frequency signal passing through said means for bandpass filtering and for automatically ceasing adjustment of the center frequency of the bandpass range in response thereto;

means for discerning the message from the filtered intermediate frequency signal; and means for controlling performance of the requested function of the message.

2. An apparatus as set forth in claim 1, wherein said means for bandpass filtering includes circuitry having an adjustable electrical characteristic that is controlled via an applied voltage signal.

3. An apparatus as set forth in claim 2, wherein said circuitry includes a varactor.

4. An apparatus as set forth in claim 1, wherein said means for sensing includes a comparator circuit for comparing a value of an electrical characteristic of a signal output from said means for bandpass filtering with a reference value and for determining whether said value of said electrical characteristic exceeds said reference value.

5. An apparatus as set forth in claim 1, wherein said means for bandpass filtering outputs an analog signal, said means for sensing includes means for converting said analog signal to a digital signal that has a digital value, said means for sensing also includes means for comparing said digital value with a reference value and for determining whether said digital value of said digital signal exceeds said reference value.

6. An apparatus as set forth in claim 1, wherein said means for automatically adjusting includes means for providing a signal having one of a plurality of discrete voltage levels, and means for controlling said means for providing a signal to change the signal voltage among the voltage levels.

7. An apparatus as set forth in claim 1, wherein said means for automatically adjusting includes means for generating an oscillating signal and means for providing said oscillating signal to said means for bandpass filtering to adjust the bandpass range.

8. A receiver/controller apparatus for a remote convenience system, said apparatus being responsive to a function request transmitted by a portable transmitter for controlling performance of an associated function, said apparatus comprising:

means for receiving a signal, transmitted from the transmitter, which has a RF frequency, at an unknown value within a range of values, and which conveys a message that contains the function request, and for providing a RF signal having the RF frequency and conveying the message;

means for providing a reference frequency signal;

means for mixing the RF signal with the reference frequency signal to provide an intermediate frequency signal conveying the message, the frequency of the intermediate frequency signal being at an unknown value within a known range of values;

means for bandpass filtering the intermediate frequency signal to pass a range of frequency values smaller than the known range of intermediate frequency values, the bandpass range having a center frequency;

means for automatically adjusting the center frequency of the bandpass range of said means for bandpass filtering to vary the bandpass range over the intermediate frequency range;

means for sensing the intermediate frequency signal passing through said means for bandpass filtering and for automatically ceasing adjustment of the center frequency of the bandpass range in response thereto;

means for discerning the message from the filtered intermediate frequency signal; and means for controlling performance of the requested function of the message;

said means for automatically adjusting including means for generating an oscillating signal and means for providing said oscillating signal to said means for bandpass filtering to adjust the bandpass range, and said means for providing said oscillating signal to said means for bandpass filtering including switch means for selectively gating said oscillating signal toward said means for bandpass filtering.

9. An apparatus as set forth in claim 8, wherein said means for automatically adjusting includes a multivibrator for controlling said switch means.

10. An apparatus as set forth in claim 8, wherein said means for automatically adjusting includes a microprocessor for controlling said switch means.

11. An apparatus as set forth in claim 8, wherein said switch means has first and second states, said apparatus further includes a circuit having a RC constant connected to said oscillator when said switch means is in said first state and disconnected from said oscillator when said switch means is in said second state, said oscillator controls the bandpass of said means for bandpass filtering when said switch means is in said first state and said circuit having said RC constant controls the bandpass of said means for bandpass filtering when said switch means is in said second state.

12. An apparatus as set forth in claim 8, wherein said switch means has first and second states, said apparatus further includes means for monitoring an electrical characteristic of said oscillating signal, means for determining the value of the monitored characteristic associated with passage of the intermediate frequency signal through said means for bandpass filtering, and means for providing a signal indicative of said determined characteristic value, said oscillating signal is used to control the bandpass of said means for bandpass filtering when said switch means is in said first state and said signal indicative of said determined characteristic value is used to control the bandpass of said means for bandpass filtering when said switch means is in said second state.

13. An apparatus as set forth in claim 1, wherein said means for automatically adjusting includes means for adjusting the bandpass to one bandpass range among a plurality of discrete bandpass ranges.

14. A receiver/controller apparatus for a remote convenience system, said apparatus being responsive to a function request transmitted by a portable transmitter for controlling performance of an associated function, said apparatus comprising:

means for receiving a signal, transmitted from the transmitter, which has a RF frequency, at an unknown value within a range of values, and which conveys a message that contains the function request, and for providing a RF signal having the RF frequency and conveying the message;

means for providing a reference frequency signal;

means for mixing the RF signal with the reference frequency signal to provide an intermediate frequency signal conveying the message, the frequency of the intermediate frequency signal being at an unknown value within a known range of values;

means for bandpass filtering the intermediate frequency signal to pass a range of frequency values smaller than the known range of intermediate frequency values, the bandpass range having a center frequency;

means for automatically adjusting the center frequency of the bandpass range of said means for bandpass filtering to vary the bandpass range over the intermediate frequency range;

means for sensing the intermediate frequency signal passing through said means for bandpass filtering and for automatically ceasing adjustment of the center frequency of the bandpass range in response thereto;

means for discerning the message from the filtered intermediate frequency signal; and means for controlling performance of the requested function of the message;

said means for automatically adjusting including means for adjusting the bandpass to one bandpass range among a plurality of discrete bandpass ranges, at least two of the plurality of bandpass ranges having overlapping portions, and said apparatus further including means for determining a bandpass range for said means for bandpass filtering when the intermediate frequency is located in overlapping portions of a plurality of bandpass ranges.

15. A remote convenience system for remote controlling performance of a function, said system comprising:

portable transmitter means for remote control requests, including means for transmitting a RF signal conveying a message which contains a function request, the frequency of the RF signal being at an unknown value within a range of values; and receiver/controller means for receiving remote control requests and for controlling performance of the requested function, including means for receiving the signal transmitted from said transmitter means and for providing a RF signal having the RF frequency and conveying the message, means for providing a reference frequency signal, means for mixing the RF signal with the reference frequency signal to provide an intermediate frequency signal conveying the message, the frequency of the intermediate frequency signal being at an unknown value within a known range of values, means for bandpass filtering the intermediate frequency signal to pass a range of frequency values smaller than the known range of intermediate frequency values, the bandpass range having a center frequency, means for automatically adjusting the center frequency of the bandpass range of said means for bandpass filtering to vary the bandpass range over the intermediate frequency range, means for sensing the intermediate frequency signal passing through said means for bandpass filtering and for automatically ceasing adjustment of the center frequency of the bandpass range in response thereto.

16. A system as set forth in claim 15, wherein said means for bandpass filtering includes circuitry having an adjustable electrical characteristic that is controlled via an applied voltage signal.

17. A system as set forth in claim 16, wherein said circuitry includes a varactor.

18. A system as set forth in claim 15, wherein said means for sensing includes a comparator circuit for comparing a value of an electrical characteristic of a signal output from said means for bandpass filtering with a reference value and for determining whether said value of said electrical characteristic exceeds said reference value.

19. A system as set forth in claim 15, wherein said means for bandpass filtering outputs an analog signal, said means for sensing includes means for converting said analog signal to a digital signal that has a digital value, said means for sensing also includes means for comparing said digital value with a reference value and for determining whether said digital value of said digital signal exceeds said reference value.

20. A system as set forth in claim 15, wherein said means for automatically adjusting includes means for providing a signal having one of a plurality of discrete voltage levels, and means for controlling said means for providing a signal to change the signal voltage among the voltage levels.

21. A system as set forth in claim 15, wherein said means for automatically adjusting includes means for generating an oscillating signal and means for providing said oscillating signal to said means for bandpass filtering to adjust the bandpass range.

22. A remote convenience system for remote controlling performance of a function, said system comprising:

portable transmitter means for remote control requests, including means for transmitting a RF signal conveying a message which contains a function request, the frequency of the RF signal being at an unknown value within a range of values; and receiver/controller means for receiving remote control requests and for controlling performance of the requested function, including means for receiving the signal transmitted from said transmitter means and for providing a RF signal having the RF frequency and conveying the message; means for providing a reference frequency signal; means for mixing the RF signal with the reference frequency signal to provide an intermediate frequency signal conveying the message, the frequency of the intermediate frequency signal being at an unknown value within a known range of values; means for bandpass filtering the intermediate frequency signal to pass a range of frequency values smaller than the known range of intermediate frequency values, the bandpass range having a center frequency; means for automatically adjusting the center frequency of the bandpass range of said means for bandpass filtering to vary the bandpass range over the intermediate frequency range; means for sensing the intermediate frequency signal passing through said means for bandpass filtering and for automatically ceasing adjustment of the center frequency of the bandpass range in response thereto;

said means for automatically adjusting including means for generating an oscillating signal and means for providing said oscillating signal to said means for bandpass filtering to adjust the bandpass range, and said means for providing said oscillating signal to said means for bandpass filtering includes switch means for selectively gating said oscillating signal toward said means for bandpass filtering.

23. A system as set forth in claim 22, wherein said means for automatically adjusting includes a multivibrator for controlling said switch means.

24. A system as set forth in claim 22, wherein said means for automatically adjusting includes a microprocessor for controlling said switch means.

25. A system as set forth in claim 22, wherein said switch means has first and second states, said receiver/controller means further includes a circuit having a RC constant connected to said oscillator when said switch means is in said first state and disconnected from said oscillator when said switch means is in said second state, said oscillator controls the bandpass of said means for bandpass filtering when said switch means is in said first state and said circuit having said RC constant controls the bandpass of said means for bandpass filtering when said switch means is in said second state.

26. A system as set forth in claim 22, wherein said switch means has first and second states, said receiver/controller means further includes means for monitoring an electrical characteristic of said oscillating signal, means for determining the value of the monitored characteristic associated with passage of the intermediate frequency signal through said means for bandpass filtering, and means for providing a signal indicative of said determined characteristic value, said oscillating signal is used to control the bandpass of said means for bandpass filtering when said switch means is in said first state and said signal indicative of said determined characteristic value is used to control the bandpass of said means for bandpass filtering when said switch means is in s aid second state.

27. A system as set forth in claim 15, wherein said means for automatically adjusting includes means for adjusting the bandpass to one bandpass range among a plurality of discrete bandpass ranges.

28. A remote convenience system for remote controlling performance of a function, said system comprising:

portable transmitter means for remote control requests, including means for transmitting a RF signal conveying a message which contains a function request, the frequency of the RF signal being at an unknown value within a range of values; and receiver/controller means for receiving remote control requests and for controlling performance of the requested function, including means for receiving the signal transmitted from said transmitter means and for providing a RF signal having the RF frequency and conveying the message; means for providing a reference frequency signal; means for mixing the RF signal with the reference frequency signal to provide an intermediate frequency signal conveying the message, the frequency of the intermediate frequency signal being at an unknown value within a known range of values; means for bandpass filtering the intermediate frequency signal to pass a range of frequency values smaller than the known range of intermediate frequency values, the bandpass range having a center frequency; means for automatically adjusting the center frequency of the bandpass range of said means for bandpass filtering to vary the bandpass range over the intermediate frequency range; means for sensing the intermediate frequency signal passing through said means for bandpass filtering and for automatically ceasing adjustment of the center frequency of the bandpass range in response thereto;

said means for automatically adjusting including means for adjusting the bandpass to one bandpass range among a plurality of discrete bandpass ranges, at least two of the plurality of bandpass ranges having overlapping portions, said apparatus further including means for determining a bandpass range for said means for bandpass filtering when the intermediate frequency is located in overlapping portions of a plurality of bandpass ranges.

29. A method of receiving a function request transmitted by a portable transmitter for control of performance of a function, said method comprising:

receiving a transmitted signal from the transmitter, the transmitted signal having a RF frequency at an unknown value within a range of values and conveying a message which contains a function request, and providing a RF signal having the RF frequency and conveying the message;

providing a reference frequency signal;

mixing the RF signal with the reference frequency signal to provide an intermediate frequency signal conveying the message, the frequency of the intermediate frequency signal being at an unknown value within a known range of values;

bandpass filtering the intermediate frequency signal to pass a range of frequency values smaller than the known range of intermediate frequency values, the bandpass range having a center frequency;

automatically adjusting the center frequency of the bandpass range for the bandpass filtering to vary the bandpass range over the intermediate frequency range;

sensing the intermediate frequency signal being bandpassed and automatically ceasing adjustment of the center frequency of the bandpass range in response thereto;

discerning the message from the filtered intermediate frequency signal; and controlling performance of the requested function of the message.

30. A method of remote control performance of a function, said method comprising:

transmitting a RF signal conveying a message which contains a function request, the frequency of the RF signal being at an unknown value within a range of values;

receiving the transmitted RF signal, and providing a RF signal having the RF frequency and conveying the message;

providing a reference frequency signal;

mixing the RF signal with the reference frequency signal to provide an intermediate frequency signal conveying the message, the frequency of the intermediate frequency signal being at an unknown value within a known range of values;

bandpass filtering the intermediate frequency signal to pass a range of frequency values smaller than the known range of intermediate frequency values, the bandpass range having a center frequency;

automatically adjusting the center frequency of the bandpass range for the bandpass filtering to vary the bandpass range over the intermediate frequency range;

sensing the intermediate frequency signal being bandpassed and automatically ceasing adjustment of the center frequency of the bandpass range in response thereto;

discerning the message from the filtered intermediate frequency signal; and controlling performance of the requested function of the message.

* * * * *